(12) United States Patent
Konrad et al.

(10) Patent No.: US 9,723,720 B2
(45) Date of Patent: Aug. 1, 2017

(54) DEVICE FOR PRODUCING AND/OR PROCESSING A WORKPIECE

(71) Applicant: KONRAD GMBH, Radolfzell (DE)

(72) Inventors: Michael Konrad, Radolfzell (DE); Stefan Werner, Radolfzell (DE)

(73) Assignee: Konrad GmbH, Radolfzell (DE)

( * ) Notice: Subject to any disclaimer, the term of this patent is extended or adjusted under 35 U.S.C. 154(b) by 249 days.

(21) Appl. No.: 14/414,025

(22) PCT Filed: Jul. 12, 2013

(86) PCT No.: PCT/EP2013/064817
§ 371 (c)(1),
(2) Date: Jan. 9, 2015

(87) PCT Pub. No.: WO2014/009542
PCT Pub. Date: Jan. 16, 2014

(65) Prior Publication Data
US 2015/0128408 A1    May 14, 2015

(30) Foreign Application Priority Data

Jul. 12, 2012  (DE) .................. 10 2012 106 291

(51) Int. Cl.
*H05K 3/00*    (2006.01)

(52) U.S. Cl.
CPC . *H05K 3/0008* (2013.01); *H05K 2201/09918* (2013.01); *H05K 2203/162* (2013.01); *H05K 2203/166* (2013.01); *Y10T 29/53261* (2015.01)

(58) Field of Classification Search
CPC ........ G06K 9/00; G06F 19/00; H05K 3/0008; H05K 2201/09918; H05K 2203/162; H05K 2203/166; Y10T 29/53261
See application file for complete search history.

(56) References Cited

U.S. PATENT DOCUMENTS

| | | | | |
|---|---|---|---|---|
| 4,247,203 A | * | 1/1981 | Levy | .................. G03F 1/84 356/390 |
| 5,204,912 A | * | 4/1993 | Schimanski | ....... G01R 31/2808 348/126 |
| 5,247,249 A | | 9/1993 | Seavey | |

(Continued)

FOREIGN PATENT DOCUMENTS

| | | |
|---|---|---|
| DE | 4416151 C1 | 7/1995 |
| DE | 19646252 A1 | 5/1998 |

(Continued)

OTHER PUBLICATIONS

European Patent Office; International Search Report and Written Opinion in corresponding International Application No. PCT/EP2013/064817. Date of Mailing: Jan. 2, 2014.

(Continued)

*Primary Examiner* — Carl Arbes
(74) *Attorney, Agent, or Firm* — Fishman Stewart PLLC

(57) ABSTRACT

In a device for producing and/or processing a workpiece, in particular circuit boards (1), in a work station (2), in particular for printing a corresponding blank or for checking finished circuit boards (1), at least one mark (15) is provided on the workpiece. In this arrangement, at least one reference (14), which can be brought into alignment with the mark (15), is provided in the work station (2).

15 Claims, 3 Drawing Sheets

(56) References Cited

U.S. PATENT DOCUMENTS

| | | | |
|---|---|---|---|
| 5,395,099 A | 3/1995 | Hall | |
| 5,572,598 A * | 11/1996 | Wihl | G01N 21/95607 356/398 |
| 6,434,264 B1 * | 8/2002 | Asar | G01N 21/95607 382/147 |
| 6,710,798 B1 * | 3/2004 | Hershel | G01R 31/2887 324/750.23 |
| 2002/0079276 A1 | 6/2002 | Miyake | |
| 2005/0209822 A1 * | 9/2005 | Ishiba | H05K 13/08 702/185 |
| 2012/0113247 A1 | 5/2012 | Tanemura et al. | |
| 2012/0327215 A1 * | 12/2012 | Case | G01N 21/8806 348/92 |

FOREIGN PATENT DOCUMENTS

| | | |
|---|---|---|
| DE | 112006003034 T5 | 10/2008 |
| JP | H05273288 A | 10/1993 |
| JP | 2001235507 A | 8/2001 |
| JP | 2002181874 A | 6/2002 |

OTHER PUBLICATIONS

European Patent Office, International Preliminary Report on Patentability in corresponding International Application No. PCT/EP2013/064817. Date of Report: Jan. 15, 2015.

\* cited by examiner

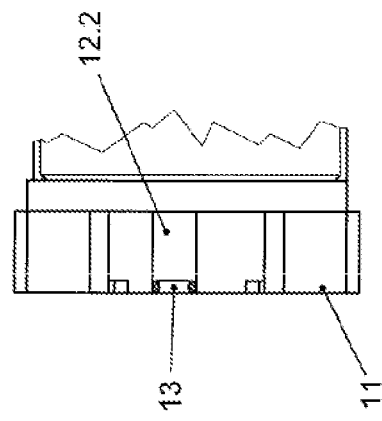
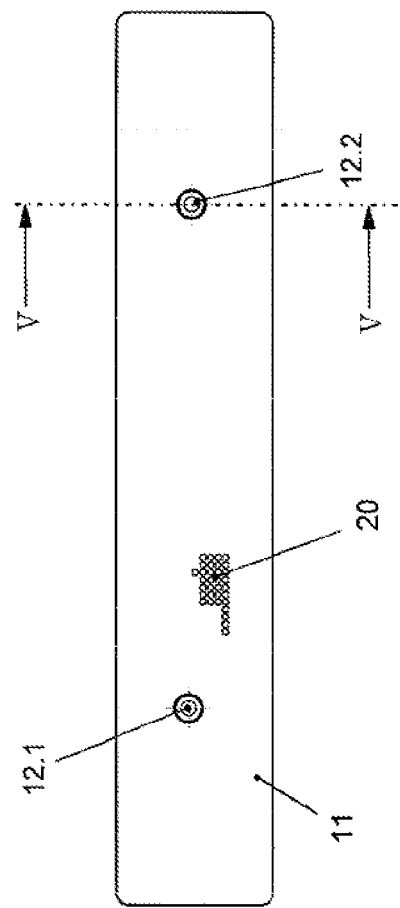
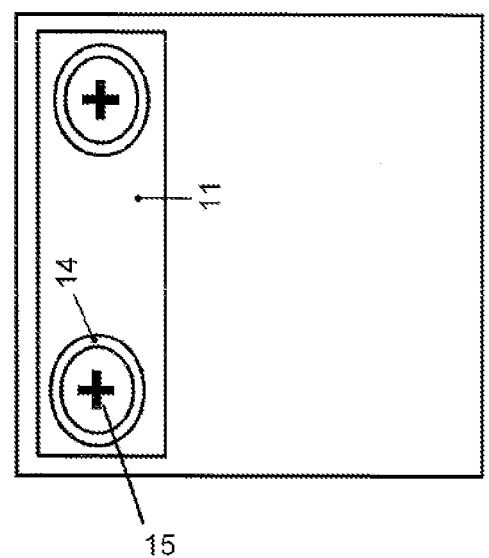

US 9,723,720 B2

DEVICE FOR PRODUCING AND/OR PROCESSING A WORKPIECE

The invention relates to a device for producing and/or processing a workpiece, in particular circuit boards in a work station, in particular for printing a corresponding blank or for checking finished circuit boards, where at least one mark is provided on the workpiece, as well as a method for this purpose.

PRIOR ART

Testing devices for examining populated electronic circuit boards for defects and function prior to installation in electronic devices have been both known and commercially available for a long time. In devices of this type, contact pins or needles are pressed onto predetermined sites (contact positions) of the circuit board and then loaded by a test computer with test signals according to a predetermined control to ascertain whether the populated circuit board is functioning properly. To establish perfect electrical contact between the contact needles and contact points on a circuit board which picks off a large number of contact positions, several thousand contact needles are often necessary or possible.

Testing devices of this type are described, for example, in DE 11 2006 003 034 T5 as well as DE 196 46 252 A1 or DE 44 16 151 B. However, each of these devices requires that the circuit boards being tested are precisely matched to the test pins. The necessity of a plethora of tests of this type being performed within a temporal unit entails considerable problems when positioning the circuit board in relation to the test pins.

The present invention relates, however, not only to the production and processing of circuit boards, but also to the production and processing of any given workpieces.

PROBLEM

The present invention seeks to solve the problem of developing a device of the type specified above which facilitates precise positioning of the workpiece in relation to a tool, test pin or similar and which, however, can also be used for various applications.

SOLUTION OF THE PROBLEM

The problem can be solved by having in the work station at least one reference that can be brought into alignment with the mark.

In the present case, the workpiece, in particular the circuit board or blank, should preferably be aligned prior to printing or any type of processing. This is accomplished by having at least one mark arranged on the blank/circuit board and by having these marks brought into alignment with a reference. The mark can be, for example, a simple cross, while the reference can be a reference ring. For precise positioning, the cross must be located entirely within the ring.

In a preferred exemplary embodiment, the reference is arranged in a drill hole in the hold-down plate itself. Located above the hold-down plate is a camera which looks through the drill hold and reference and watches the mark. The camera thus records precisely and without distorting the image showing how the reference is arranged in relation to the mark. If this relationship is incorrect, the position of the circuit board must be adjusted. Within the scope of this invention, it is of course conceivable, albeit more technically involved, that the hold-down plate can be adjusted jointly with the carrier plate for the test pins.

If the position of the circuit board must be adjusted, then an appropriate control unit activates an adjustment unit according to coordinates input by the camera. This adjustment unit should preferably be able to alter the position of at least the hold-down plate and the carrier plates with the test pins in at least one plane. In this case, the transport mechanism is spatially fixed for the circuit board. However, the opposite arrangement in which namely one unit each from the hold-down plate and the carrier plates with the test pins is in fixed position, while the transport mechanism can be adjusted in a plane is also conceivable.

In a simple exemplary embodiment, the adjustment element features a base plate mounted in a floating manner which is moved in the X- and Y-direction by means of at least one, however, preferably three eccentric tappets. This movement occurs against the force of opposite lying force accumulators which can be realized as spring-loaded pins, for example.

For the sake of simplicity, the eccentric tappets themselves are commercially available ball bearings which, however, rest eccentrically on the shaft of a step motor. However, other embodiments are also conceivable here and should fall under the scope of the inventive concept.

The method according to the invention is characterized above all by the fact that the mark is brought into alignment with the reference. The reference is situated preferably in the hold-down plate. Prior to alignment this is driven as close as possible to the circuit board without touching it, however, such that displacing the transport mechanism does not cause the circuit board to shift on the transport mechanism. Only once the mark and the reference are in alignment, is the hold-down plate lowered and the circuit board held tight and checked.

DESCRIPTION OF FIGURES

Additional advantages, features and details of the invention are contained in the following description of preferred exemplary embodiments as well as in the drawing, which illustrates:

FIG. 4 a top view of a hold-down area;

FIG. 5 a section through the partial area illustrated in FIG. 3 along line IV-IV;

FIG. 6 a schematically illustrated top view of a partial area of a circuit board or blank in the work station of the device as illustrated in FIG. 1.

Figure 1:
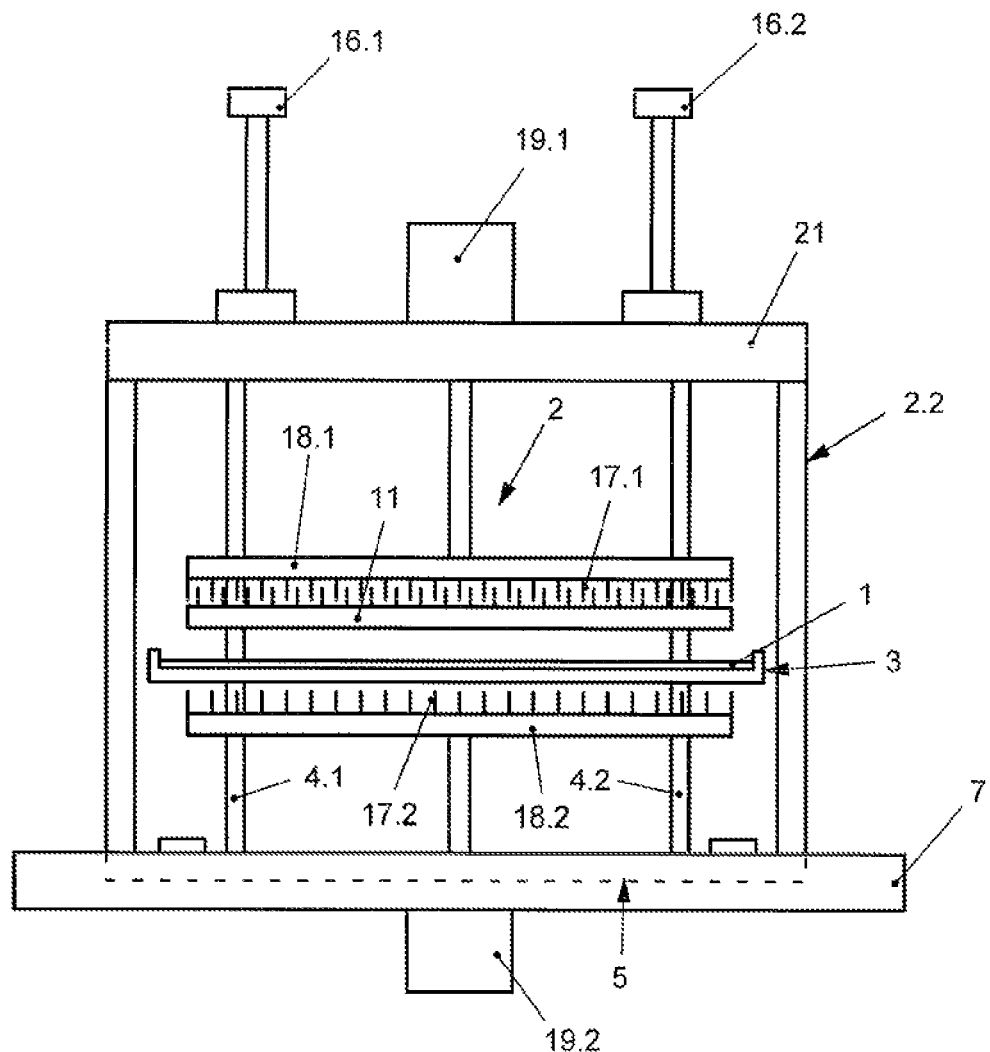
FIG. 1 a schematically illustrated frontal view of a device according to the invention for producing and/or processing circuit boards in a work station.

According to FIG. 1, a circuit board 1 is to be processed, in this case tested, in a work station 2. In this exemplary embodiment, this workstation 2 features two carrier plates 18.1, 18.2 arranged one-over-the-other with test pins 17.1, 17.2 arranged thereon, the test pins 17.1 and 17.2 facing one another. Located therebetween is a hold-down plate 11. The carrier plates 18.1, 18.2 and the hold-down plate 11 are slidably arranged on guide columns 4.1, 4.2. The movement thereof along the guide columns 4.1, 4.2 is generated by corresponding drives, only the two drives 19.1 and 19.2 for carrier plates 18.1 and 18.2 being shown.

The drive 19.1 is located on a cross bar 21 of a support frame 22, which in turn rests on an adjustment unit 5 by means of which the entire workstation 2 can be moved relative to the transport mechanism 3 and a base frame 7.

The circuit board 1 rests on the transport mechanism 3 of any type which is fixed in relation to the other construction elements (not further illustrated in the drawing) of the device according to the invention, for example on the frame 7.

Figure 2:
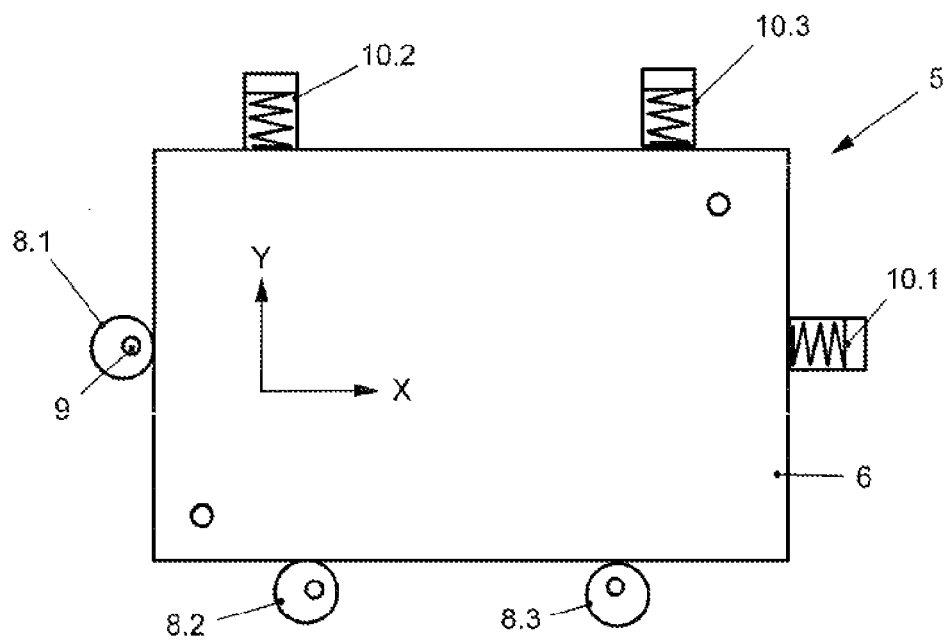
FIG. 2 a schematic top view of an adjustment unit according to the invention for the device illustrated in FIG. 1.

The adjustment unit 5 is provided in this frame 7. As FIG. 2 shows, this unit features a plate 6 which is mounted in a floating manner in the frame 7. This means that the plate 6 can be moved within the frame 7 in the X and Y directions. This is effected by eccentric tappets 8.1 through 8.3 which, according to an exemplary embodiment, are each comprised of a ball bearing which rests eccentrically on a shaft 9 of a step motor not illustrated in greater detail. Opposite each of the eccentric tappets 8.1 through 8.3 is a force accumulator 10.1 through 10.3 which can, for the sake of simplicity, be a helical spring.

Above the transport mechanism 3 is a hold-down plate 11, which can be moveable in relation to the circuit board 1 in any desired manner. As FIGS. 4 and 5 show, it possesses two drill holes 12.1 and 12.2 in which a reference disc 13 is inserted. Located on this reference disc is a reference, in this case for example a reference ring 14 as shown in FIG. 6, with which a mark 15 on the circuit board 1 must be brought into alignment. For each drill hole 12.1 and 12.2 a dedicated camera 16.1 and 16.2, respectively, is assigned, each of which looks through the drill hole 12.1, 12.2 and the reference disc 13 to the mark 15, as the dashed line indicates.

Figure 3:
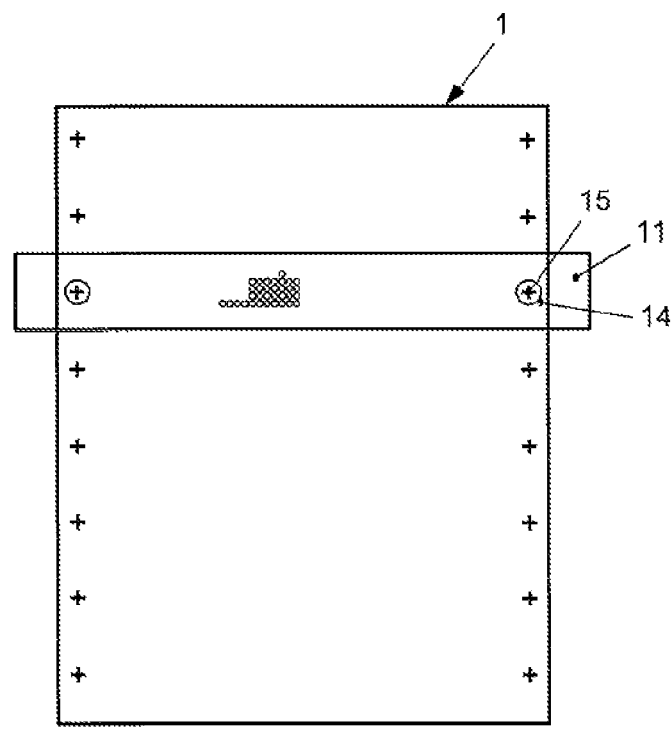
FIG. 3 a top view of a partial area of a transport mechanism for circuit boards in a device as illustrated in FIG. 1.

The mode of function of the present invention is described below:

A circuit board 1 with multiple individual blanks in panels, as illustrated in FIG. 3, is transported through the workstation 2 by means of the fixed transport mechanism 3, each aligned with and contacted by the corresponding test pins 17.1, 17.2 on the carrier plates 18.1, 18.2. This occurs by means of the corresponding drives 19.1, 19.2.

However, the circuit board must be aligned before the carrier plates 18.1, 18.2 with the test pins 17.1, 17.2 are lowered onto the circuit board 1 through the corresponding drill holes 20 in the hold-down plate 11. For this purpose, the hold-down plate 11 is driven directly against the circuit board 1, but without touching it. The relationship between the reference ring 14 and the mark 15 is observed via the two cameras 16.1 and 16.2. If the mark 15 is outside the reference ring 14, then the work station 2 must be adjusted in relation to the position of the circuit board, which is performed by means of an adjustment unit 5. The plate 6 and thereby the entire support frame 22 move in both the X- and Y-direction via the eccentric tappets 8.1 through 8.3 against the force of the force accumulators 10.1 through 10.3.

Afterward, the hold-down plate 11 can be lowered entirely, and the circuit board 1 can fixed between the transport mechanism 3 and the hold-down plate. The drive 19.1 now lowers also the carrier plate 18.1 with the test pins 17.1, which charge and test the circuit board 1 through the drill holes 20 in the hold-down plate 11. Extremely precise positioning is thereby enabled. Contact can now be made with the smallest structures.

As mentioned above, the device according to the invention can be used not only for testing circuit boards, but also for the production thereof, for example. If, for example, circuit boards are produced using the silk screen printing, then the screen can accordingly be aligned over the circuit boards.

| List of reference numerals | |
|---|---|
| 1 | Circuit board |
| 2 | Work station |
| 3 | Transport mechanism |
| 4 | Guide column |
| 5 | Adjustment unit |
| 6 | Plate |
| 7 | Support frame |
| 8 | Eccentric tappet |
| 9 | Shaft |
| 10 | Force accumulator |
| 11 | Hold-down plate |
| 12 | Drill hole |
| 13 | Reference disc |
| 14 | Reference |
| 15 | Mark |
| 16 | Camera |
| 17 | Test pin |
| 18 | Carrier plate |
| 19 | Drive |
| 20 | Drill holes |
| 21 | Cross bar |
| 22 | Support frame |

-continued

List of reference numerals

| X | direction |
|---|---|
| Y | direction |

The invention claimed is:

1. A device for producing and/or processing circuit boards in a work station, the device comprising:
 a device configured to provide at least one mark on a circuit board, the mark on the circuit board configured for alignment with at least one reference provided with said work station;
 wherein the circuit board is provided on a fixed transportation mechanism; and including at least one eccentric tappet configured to strike against at least one edge of a plate.

2. The device of claim 1, wherein the at least one eccentric tappet comprises an eccentrically mounted ball bearing.

3. The device of claim 1, including a step motor operatively connected to the eccentric tappet.

4. The device of claim 1, including a force accumulator operatively connected to the eccentric tappet on the opposite side of the at least one edge of a plate.

5. The device of claim 4, wherein the force accumulator comprises a spring.

6. A device for producing and/or processing circuit boards in a work station, the device comprising:
 a device configured to provide at least one mark on a circuit board, the mark on the circuit board configured for alignment with at least one reference provided with said work station;
 wherein the circuit board is provided on a fixed transportation mechanism; and the at least one reference is provided in a holddown plate, and the hold-down plate is configured to be lowered down to the circuit board in the work station.

7. The device of claim 6, wherein the mark on the circuit board is a cross.

8. The device of claim 6, wherein the at least one reference is a ring.

9. The device of claim 6, including an adjustment unit having a plate mounted in a floating manner that can be adjusted in a plane and in the X-direction and Y-direction.

10. The device of claim 6, wherein at least one eccentric tappet is configured to strike against two neighboring edges of a plate.

11. The device of claim 6, wherein the hold-down plate includes at least one drill hole.

12. The device of claim 11, wherein the reference is arranged with or aligned in the at least one drill hole.

13. The device of claim 6, wherein the reference is laser-etched in or on at least a partly transparent disc.

14. The device of claim 6, wherein the hold-down plate is driven directly to the circuit board without touching it.

15. A device for producing and/or processing circuit boards in a work station, the device comprising:
 a device configured to provide at least one mark on a circuit board, the mark on the circuit board configured for alignment with at least one reference provided with said work station;
 wherein the circuit board is provided on a fixed transportation mechanism, the at least one reference is provided in a holddown plate; the hold-down plate is configured to be lowered down to the circuit board in the work station, the hold-down plate is driven directly to the circuit board without touching it, and the mark and the reference are viewable through the hold-down plate by a camera that views the mark and the reference.

* * * * *